US006627333B2

(12) United States Patent
Hatwar

(10) Patent No.: US 6,627,333 B2
(45) Date of Patent: Sep. 30, 2003

(54) WHITE ORGANIC LIGHT-EMITTING DEVICES WITH IMPROVED EFFICIENCY

(75) Inventor: Tukaram K. Hatwar, Penfield, NY (US)

(73) Assignee: Eastman Kodak Company, Rochester, NY (US)

(*) Notice: Subject to any disclaimer, the term of this patent is extended or adjusted under 35 U.S.C. 154(b) by 72 days.

(21) Appl. No.: 09/930,050

(22) Filed: Aug. 15, 2001

(65) Prior Publication Data

US 2003/0068524 A1 Apr. 10, 2003

(51) Int. Cl.[7] ............................................. H05B 33/14
(52) U.S. Cl. ..................... 428/690; 428/917; 313/502; 313/504; 313/506; 257/89
(58) Field of Search ................... 428/690, 917; 427/66; 313/502, 504, 506; 257/88, 89, 98

(56) References Cited

U.S. PATENT DOCUMENTS

| | | | |
|---|---|---|---|
| 4,539,507 A | 9/1985 | VanSlyke et al. | 313/504 |
| 4,769,292 A | 9/1988 | Tang et al. | 428/690 |
| 4,885,211 A | 12/1989 | Tang et al. | 428/457 |
| 5,059,862 A | 10/1991 | VanSlyke et al. | 313/503 |
| 5,405,709 A | 4/1995 | Littman et al. | 428/690 |
| 5,503,910 A * | 4/1996 | Matsuura et al. | 428/212 |
| 5,550,066 A | 8/1996 | Tang et al. | 437/40 |
| 5,593,788 A | 1/1997 | Shi et al. | 428/690 |
| 5,645,948 A | 7/1997 | Shi et al. | 428/690 |
| 5,683,823 A | 11/1997 | Shi et al. | 428/690 |
| 5,684,365 A | 11/1997 | Tang et al. | 315/169.3 |
| 5,776,622 A | 7/1998 | Hung et al. | 428/690 |
| 5,779,937 A * | 7/1998 | Sano et al. | 252/301.16 |
| 5,792,557 A * | 8/1998 | Nakaya et al. | 428/411.1 |
| 6,020,078 A | 2/2000 | Chen et al. | 428/690 |
| 6,048,631 A * | 4/2000 | Takahashi et al. | 428/690 |
| 6,091,196 A * | 7/2000 | Codama | 313/504 |
| 6,111,270 A * | 8/2000 | Xu et al. | 257/72 |
| 6,127,004 A | 10/2000 | Hatwar et al. | 427/535 |
| 6,208,075 B1 | 3/2001 | Hung et al. | 313/504 |
| 6,225,467 B1 * | 5/2001 | Esteghamatian et al. | 544/180 |
| 6,251,531 B1 * | 6/2001 | Enokida et al. | 428/690 |
| 6,288,486 B1 * | 9/2001 | Tsuruoka et al. | 313/504 |

FOREIGN PATENT DOCUMENTS

JP 7142169 6/1995

OTHER PUBLICATIONS

"Achieving Full–Color Organic Light–Emitting Devices for Lightweight, Flat–Panel Displays", by P. E. Burrows et al., IEEE Transactions on Electron Devices, vol. 44, No. 8, Aug. 1997.

"Red Organic Light–Emitting Diodes Using an Emitting Assist Dopant" by Yuji Hamada et al., Applied Physics Letters, vol. 75, No. 12, Sep. 20, 1999, pp. 1682–1684.

"High–Efficiency Transparent Organic Light–Emitting Devices" by G. Parthasarathy et al., Applied Physics Letters, vol. 76, No. 15, Apr.10, 2000, pp. 2128–2130.

"Interface Engineering in Preparation of Organic Surface–Emitting Diodes", by L. S. Hung And C. W. Tang, Applied Physics Letters, vol. 74, No. 21, May 24, 1999, pp. 3209–3211.

"Semitransparent Cathodes for Oraganic Light Emitting Devices", by P. E. Burrows et al., Journal of Aplied Physics, vol. 87, No. 6, Mar. 15, 2000, pp. 3080–3085.

"A Metal–Free Cathode for Organic Semiconductor Devices", by G. Parthasarathy et al., Applied Physics Letters, vol. 72, No. 17, Apr. 27 1998, pp. 2138–2140.

"Transparent Organic Light Emitting Devices" by G. Gu et al., Applied Physics Letters 68 (19) May 6, 1996. pp. 2606–2608.

"White–Light–Emitting Oragnic Electroluminescent Devices Based on Interlayer Sequential Energy Transfer " by R. S.Deshpande et al., Applied Physics Letters, vol. 75, No. 7, Aug. 16, 1999, pp. 888–890.

"Multilayer White Light–Emitting Organic Electroluminescent Device", by Junji Kido et al., Science, vol. 267, Mar. 3, 1995, pp. 1332–1334.

"White Light–Emitting Organic Electroluminescent Devices Using the poly(N–vinylcarbazole) Emitter Layer Doped with Three Fluorescent Dyes" by J. Kido et al., Applied physics Letters 64 (7), Feb. 14, 1994, pp. 815–817.

* cited by examiner

Primary Examiner—Cynthia H. Kelly
Assistant Examiner—Dawn Garrett
(74) Attorney, Agent, or Firm—Raymond L. Owens

(57) ABSTRACT

An organic light-emitting diode (OLED) device which produces substantially white light includes a substrate; an anode disposed over the substrate; and a hole injecting layer disposed over the anode. The device also includes a hole transport layer disposed over the hole injecting layer; a light-emitting layer doped with a blue light-emitting compound, disposed directly on the hole transport layer; and an electron transport layer disposed over the blue light-emitting layer. The device further includes a cathode disposed over the electron transport layer; and the hole transport layer, electron transport layer, or the electron transport layer and the hole transport layer being selectively doped in a region which corresponds to an entire layer or a partial portion of a layer in contact with the blue light-emitting layer, the selective doping being with a compound which emits light in the yellow region of the spectrum.

51 Claims, 9 Drawing Sheets

WHITE ORGANIC LIGHT-EMITTING DEVICES WITH IMPROVED EFFICIENCY

Reference is made to commonly assigned U.S. patent application Ser. No. 09/651,624 filed Aug. 30, 2000, pending entitled "White Organic Electroluminescent Devices with Improved Stability and Efficiency", by Tukaram K. Hatwar, the disclosure of which is incorporated herein.

FIELD OF THE INVENTION

The present invention relates to organic light-emitting OLED devices, which produce white light.

BACKGROUND OF THE INVENTION

An OLED device includes a substrate, an anode; a hole-transporting layer made of an organic compound, an organic luminescent layer with suitable dopants, an organic electron transport layer, and a cathode. OLED devices are attractive because of their low driving voltage, high luminance, wide-angle viewing and capability for full-color flat emission displays. Tang et al. described this multilayer OLED device in their U.S. Pat. Nos. 4,769,292 and 4,885,211.

Efficient white light producing OLED devices are considered as low cost alternative for several applications such as paper-thin light sources backlights in LCD displays, automotive dome lights and office lighting. White light producing OLED devices should be bright, efficient, and generally have Commission International d'Eclairage (CIE) chromaticity coordinates of about (0.33, 0.33). In any event, in accordance with this disclosure, white light is that light which is perceived by a user as having a white color.

The following patents and publications disclose the preparation of organic OLED devices capable of emitting white light, comprising a hole transport layer and an organic luminescent layer, and interposed between a pair of electrodes.

White light producing OLED devices have been reported before by J. Shi (U.S. Pat. No. 5,683,823) wherein, the luminescent layer includes a red and blue light-emitting materials uniformly dispersed in a host emitting material. This device has good electroluminescent characteristics, but the concentration of the red and blue dopants are very small such as 0.12% and 0.25% of the host material. These concentrations are difficult to control during large-scale manufacturing.

Sato et al. in JP 07,142,169 discloses an OLED device, capable of emitting white light, is made by sticking a blue light-emitting layer next to the hole transporting layer and followed by a green light-emitting layer having a region containing a red fluorescent layer.

Kido et al., in Science, Vol. 267, p. 1332 (1995) and in APL Vol. 64, p. 815 (1994) report a white light producing OLED device. In this device three emitter layers with different carrier transport properties, each emitting blue, green or red light, are used to generate white light.

Littman et al. in U.S. Pat. No. 5,405,709 disclose another white emitting device which is capable of emitting white light in response to hole-electron recombination and comprises a fluorescent in a visible light range from bluish green to red.

Recently, Deshpande et al., in Applied Physics Letters, vol. 75, p. 888 (1999) published white OLED device using red, blue and green luminescent layers separated by a hole blocking layer.

However, these OLED devices require very small amount of dopant concentrations, making the process difficult to control for large-scale manufacturing. Also emission color varies due to small changes in the dopant concentration.

SUMMARY OF THE INVENTION

It is an object of the present invention to produce an effective white light-emitting organic device.

It is another object of this invention to provide an efficient and stable white light producing OLED device with simple structure and which can be reproduced in manufacturing environment.

It has been found quite unexpectedly that white light producing OLED devices with high luminance efficiency and operational stability can be obtained by doping yellow dopant in the NPB hole transport layer, blue dopant in the TBADN host emission layer and green dopant in the Alq electron transport layer.

The object is achieved by an organic light-emitting diode (OLED) device which produces substantially white light, comprising:

a) a substrate;

b) an anode disposed over the substrate;

c) a hole injecting layer disposed over the anode;

d) a hole transport layer disposed over the hole injecting layer;

e) a light-emitting layer doped with a blue light-emitting compound, disposed directly on the hole transport layer;

f) an electron transport layer disposed over the blue light-emitting layer;

g) a cathode disposed over the electron transport layer;

h) the hole transport layer, electron transport layer, or the electron transport layer and the hole transport layer being selectively doped in a region which corresponds to an entire layer or a partial portion of a layer in contact with the blue light-emitting layer, the selective doping being with a compound which emits light in the yellow region of the spectrum; and i) the electron transport layer being selectively doped in a region which which corresponds to an entire layer or a partial portion of a layer in contact with the blue light-emitting layer, the selective doping being with a compound which emits light in the green region of the spectrum.

This object is further achieved by an organic light-emitting diode device which produce substantially white light, comprising:

a) a substrate;

b) an anode disposed over the substrate;

c) a hole transport layer doped with a rubrene compound for emitting light in the yellow region of the spectrum;

d) a light-emitting layer doped with a blue light-emitting compound, disposed directly on the hole transport layer, e) an electron transport layer doped with a rubrene compound for emitting light in the yellow region of the spectrum and disposed directly over the blue light-emitting layer;

f) an electron transport layer doped with a green compound for emitting light in the green region of the spectrum and disposed directly over the yellow light-emitting layer; and g) a cathode disposed over the electron transport layer.

ADVANTAGES

The following are features and advantages of the present invention:

1) a simplified OLED device for producing white light;
2) each of the individual components of the R, G and B color can be tuned independently;
3) the white OLED device can be used with pre-patterned substrate with having R, G, B color filters to produce an full color device;
4) an OLED device which is easy to control blue, yellow and green dopant concentrations;
5) OLED devices made in accordance with the present invention can be produced with high reproducibility and consistently provide high light efficiency; and
6) these devices have high operational stability and also require low drive voltage.

The drawings in FIGS. 1–7 are necessarily of a schematic nature, since the individual layers are too thin and thickness differences of the various elements too great to permit depiction to scale or to permit convenient proportionate scaling.

DETAILED DESCRIPTION OF THE INVENTION

The emission layer of an OLED comprises an organic or organometallic material that produces light, known as electroluminescence, as a result of electron-hole recombination in the layer. Hereinafter, the term organic will be taken to include both purely organic and organometallic materials. In the simplest construction of the prior art, shown in FIG. 1, an emission layer 140 is sandwiched between an anode 120 and a cathode 150. The emission layer can be a single pure material with a high luminescent efficiency. A well known material for this purpose is tris(8-quinolinolato-N1,O8)aluminum (Alq), which produces excellent green electroluminescence. The emission layer can also contain lesser amounts of other materials, conventionally called dopants, whose function is to alter the EL efficiency or the color of the emitted light. A substrate 110 provides mechanical support for the OLED and for electrical leads connecting the OLED to a source of electrical current. Layers 110 through 150 together comprise the OLED 100. The cathode, or both the anode and the substrate, are transparent to the electroluminescent light, allowing that light to be viewed. The term transparent refers to the ability to transmit no less than 80 percent of the electroluminescent light. In a variant of this structure, the cathode, rather than the anode, rests upon the substrate. In that variant, either the anode, or both the cathode and the support, are transparent to the electroluminescent light. When the cathode and anode are connected to a source of electrical current (not shown), holes are injected from the anode and electrons are injected from the cathode, and they recombine in the emission layer to produce electroluminescent light.

Figure 1:
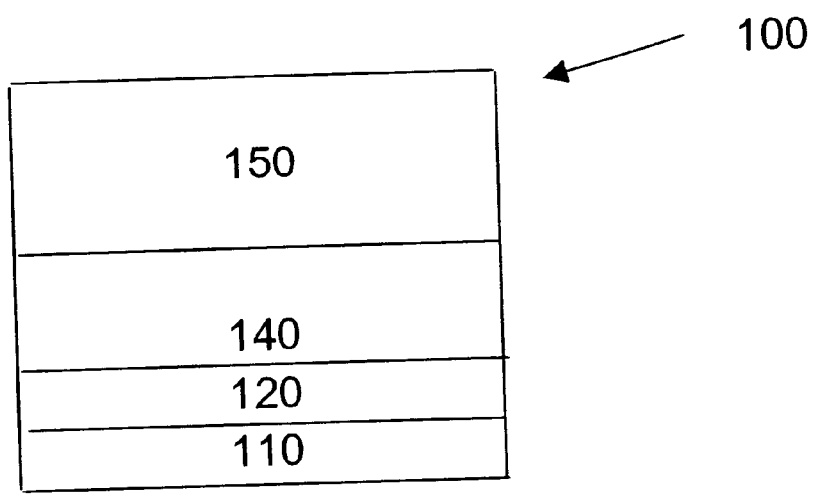
FIG. 1 depicts a prior art organic light-emitting device.
Figure 2:
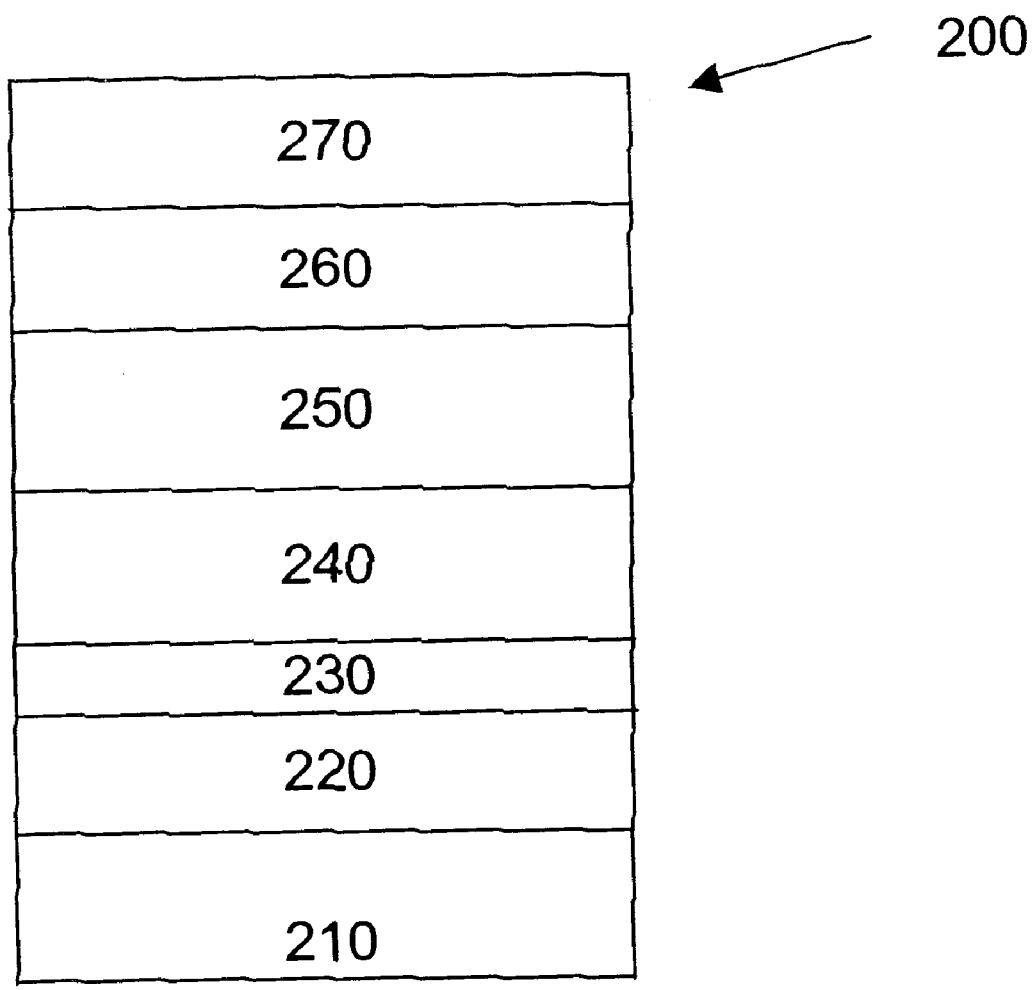
FIG. 2 depicts another prior art multi-layer organic light-emitting device.

In a more elaborate structure of the prior art, shown in FIG. 2, an emission layer 250 is situated between a hole-transport layer 240 and an electron transport layer 260. Each of these layers is composed predominantly of organic materials. The two transport layers deliver holes from an anode 220 and electrons from a cathode 270, respectively, to the emission layer. An optional hole-injection layer 230 facilitates the injection of holes from the anode to the hole-transport layer. The emission layer functions as the primary site for electron-hole recombination and emission of the resulting electroluminescent light. In this respect, the functions of the individual organic layers are distinct and can therefore be optimized independently. Thus, the emission layer can be optimized for a desirable EL color and a high luminance efficiency. The emission layer can also contain lesser amounts dopants whose function is to alter the EL efficiency or the color of the emitted light. Likewise, the hole- and electron transport layers can be optimized for their charge-transport properties. A substrate 210 provides mechanical support for the OLED and for electrical leads connecting the OLED to a source of electrical current. Layers 210 through 270 together comprise the OLED 200. Either the cathode, or both the anode and the substrate, are transparent to the electroluminescent light. In a variant of this structure, the cathode, rather than the anode, rests upon the substrate. In that variant, either the anode, or both the cathode and the support, are transparent to the electroluminescent light. In another variant of this structure, the emission layer and the electron transport layer can be combined to form a single layer that performs the functions of both. In yet another variant of this structure, an additional hole-injection layer can be inserted between the anode and the hole-transport layer. A function of this additional layer is to facilitate the injection of holes into the hole-transport layer. Similarly, it is possible for the hole-transport layer to comprise at least two sublayers of different compositions, chosen to optimize separately the charge-injecting interface at the anode and the current-carrying properties of the remainder of the hole-transport layer.

When an electrical potential difference (not shown) is applied between the anode 220 and the cathode 270, the cathode injects electrons into the electron transport layer 260, and they migrate across that layer to the emission layer 250. At the same time, holes are injected from the anode 220 into the hole-transport layer 240, and they migrate across that layer to the emission layer. The holes and electrons recombine in the emission layer 250, frequently near the junction between the hole-transport layer and the emission layer. Part of the energy released by the recombination process is emitted as electroluminescence, which escapes through the transparent anode or cathode and/or the substrate.

The organic OLED devices can be viewed as a diode, which is forward biased when the anode is at a higher potential than the cathode. The anode and cathode of the organic OLED device can each take any convenient conventional form, such as any of the various forms disclosed by Tang et al. U.S. Pat. No. 4,885,211. Operating voltage can be substantially reduced when using a low-work function cathode and a high-work function anode. The preferred cathodes are those constructed of a combination of a metal having a work function less than 4.0 eV and one other metal, preferably a metal having a work function greater than 4.0 eV. The Mg:Ag of Tang et al. U.S. Pat. No. 4,885,211 constitutes one preferred cathode construction. The Al:Mg cathodes of VanSlyke et al. U.S. Pat. No. 5,059,862 is another preferred cathode construction. Hung et al. in U.S. Pat. No. 5,776,622 has disclosed the use of a LiF/Al bilayer to enhanced electron injection in organic OLED devices. Cathodes made of either Mg:Ag, Al:Li, Al:Mg or LiF/Al are opaque and displays cannot be viewed through the cathode. Recently, series of publications (Gu et al. in APL 68, 2606 [1996]); Burrows et al., J. Appl. Phys. 87, 3080 (2000); Parthasarathy et al. APL 72, 2138 (1998); Parthasarathy et al. APL 76, 2128 (2000), Hung et al. APL, 3209 (1999) have disclosed transparent cathode. Cathode based on the combination of thin semitransparent metal (~100 A) and indium-tin-oxide (ITO) on top of the metal. An organic layer of copper phthalocyanine (CuPc) also replaced thin metal.

The substrate 210 of an OLED can be constructed of glass, quartz, or a plastic material and can, optionally, incorporate additional layers serving additional functions such as color-filter layers to remove unwanted spectral components from the electroluminescent light.

Conventional anodes 220 are formed of a conductive and transparent metal oxide. Indium tin oxide (ITO) has been widely used as the anode material because of its transparency, good conductivity, and high work function. It is the preferred anode material in the present invention.

In a preferred embodiment, a hole-injection layer 230 is disposed between the anode and the hole-transport layer. A preferred material in such a hole injection layer is a fluorocarbon ($CF_x$) such as those disclosed in commonly assigned U.S. Pat. Nos. 6,208,075 and 6,127,004.

Materials useful in the hole-transport layer of this invention include tertiary amines as taught in Van Slyke in U.S. Pat. No. 4,539,507. They can be used as the sole material of an undoped hole-transport layer or an undoped sublayer of a hole-transport layer. They can also be used as the host material in a doped hole-transport layer or a doped sublayer of a hole-transport layer. Materials of this class are currently preferred. Most preferred is NPB, namely 4,4'-Bis[N-(1-napthyl)-N-phenylamino]biphenyl as described by Van Slyke et al. in U.S. Pat. No. 4,539,507.

Materials useful in the electron transport layer of this invention include metal complexes with the 8-hydroxyquinolate anion, such as those described above, as disclosed in U.S. Pat. No. 4,885,211. Such materials both exhibit high levels of performance and are readily fabricated in thin layers. They can be used as the sole material of an undoped electron transport layer or an undoped sublayer of an electron transport layer. They can also be used as the host material in a doped electron transport layer or a doped sublayer of an electron transport layer. Materials of this class are currently preferred. Most preferred is Alq itself (also commonly referred to as 8-quinolinol or 8-hydroxyquinoline). Other materials known in the art can be used in the electron transport layer of this invention. An example is TPBI, described in U.S. Pat. No. 5,645,948 by Shi et al. If a transparent cathode is used, it is preferred to use materials in the electron transport layer that are also transparent.

A preferred embodiment of the luminescent layer consists of a host material doped with fluorescent dyes. Using this method, highly efficient EL devices can be constructed. Simultaneously, the color of the EL devices can be tuned by using fluorescent dyes of different emission wavelengths in a common host material. Tang et al. in commonly assigned U.S. Pat. No. 4,769,292 has described this dopant scheme in considerable details for EL devices using Alq as the host material.

Another class of conventional host materials for the emission layer includes 9,10-diaryl-substituted anthracenes such as 9,10-bis(4-(2,2-diphenylethenyl)phenyl)anthracene, and ADN and TBADN, whose structures are shown below. Shi et al. in commonly assigned U.S. Pat. No. 5,935,721 has described this dopant scheme in considerable details for the blue emitting OLED devices using 9,10-di-(2-naphthyl) anthracene. (ADN) derivatives as the host material.

Preferred host materials for the blue luminescent layer of this invention include:

a) ADN

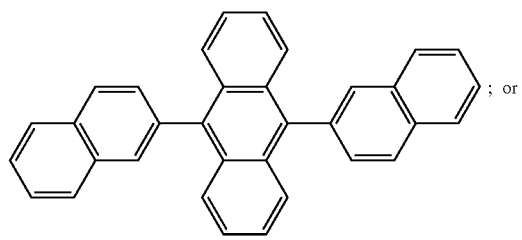

b) tertiary butyl AND (TBADN)

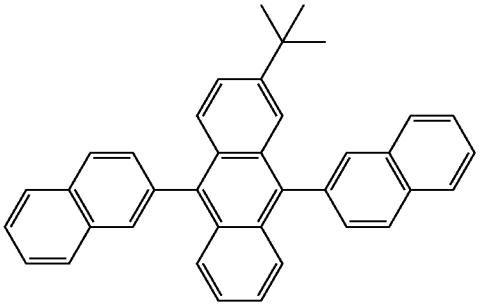

The following is the list of blue fluorescent dopants that are contemplated for use in the practice of this invention.

i) perylene

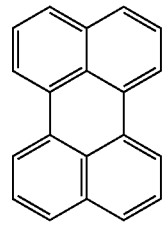

ii) 2,5,8,11-tetra-tert-butyl perylene

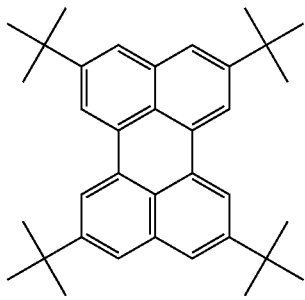

; and iii) other conjugated benzenoids

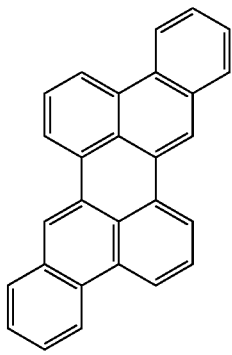

.

Preferred materials for uses as a yellow dopant in the emission layer are rubrene class materials. These are hydrocarbon compound containing a polycyclic benzoid chromophoric unit. Hamada et al. reported in Applied Phys. Lett. Vol. 75, 1682 (1999) a red color emitting OLED device by doping rubrene in hole transport layer and DCM2 dopants into Alq emission layer.

Some of the rubrene class materials and their ionization potentials are given below.

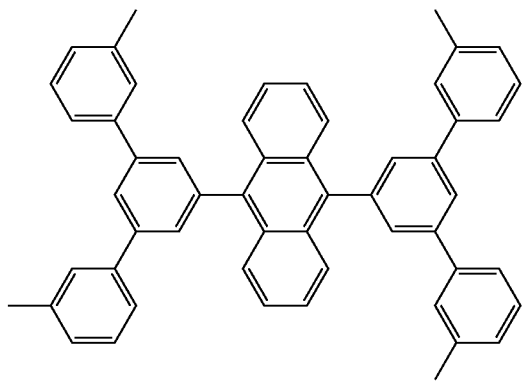

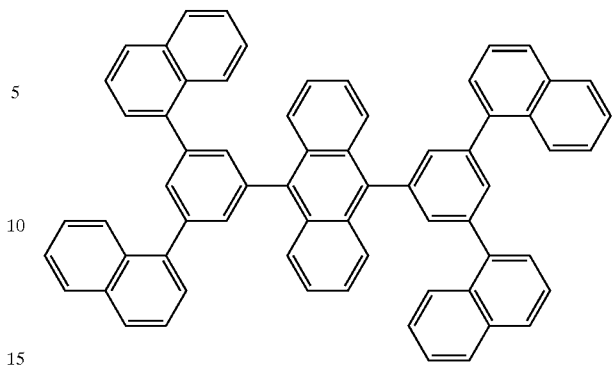

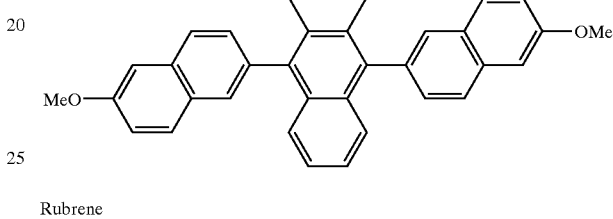

Rubrene

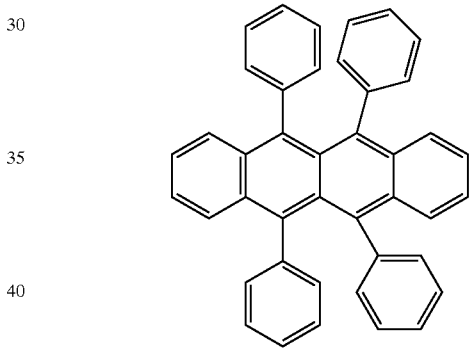

The choice of host material for the emission layer depends, in part, on the desired emission color and/or the choice of any dye to be used as a dopant in that layer, in addition to the color-neutral dopant. Host materials comprising metal complexes with derivatives of 8-hydroxyquinolate, such as Alq, are useful with dyes of the coumarin or quinacridone class used to produce efficient green emission and derivatives DCM used for red emission. A preferred green-emitting coumarin is C545T as described by Chen et al. in U.S. Pat. No. 6,020,078. A preferred green-emitting quinacridone is CFDMQA as described by Shi et al. in U.S. Pat. No. 5,593,788.

The invention and its advantages are further illustrated by the specific examples, which follows. The term "percentage" indicates the volume percentage of a particular dopant with respect to the host material.

FIGS. 3–9 show the white light producing OLED device structures prepared according to the present invention and graphs of various parameters of their operations. The invention and its advantages are further illustrated by the specific examples, which follow.

Figure 3:
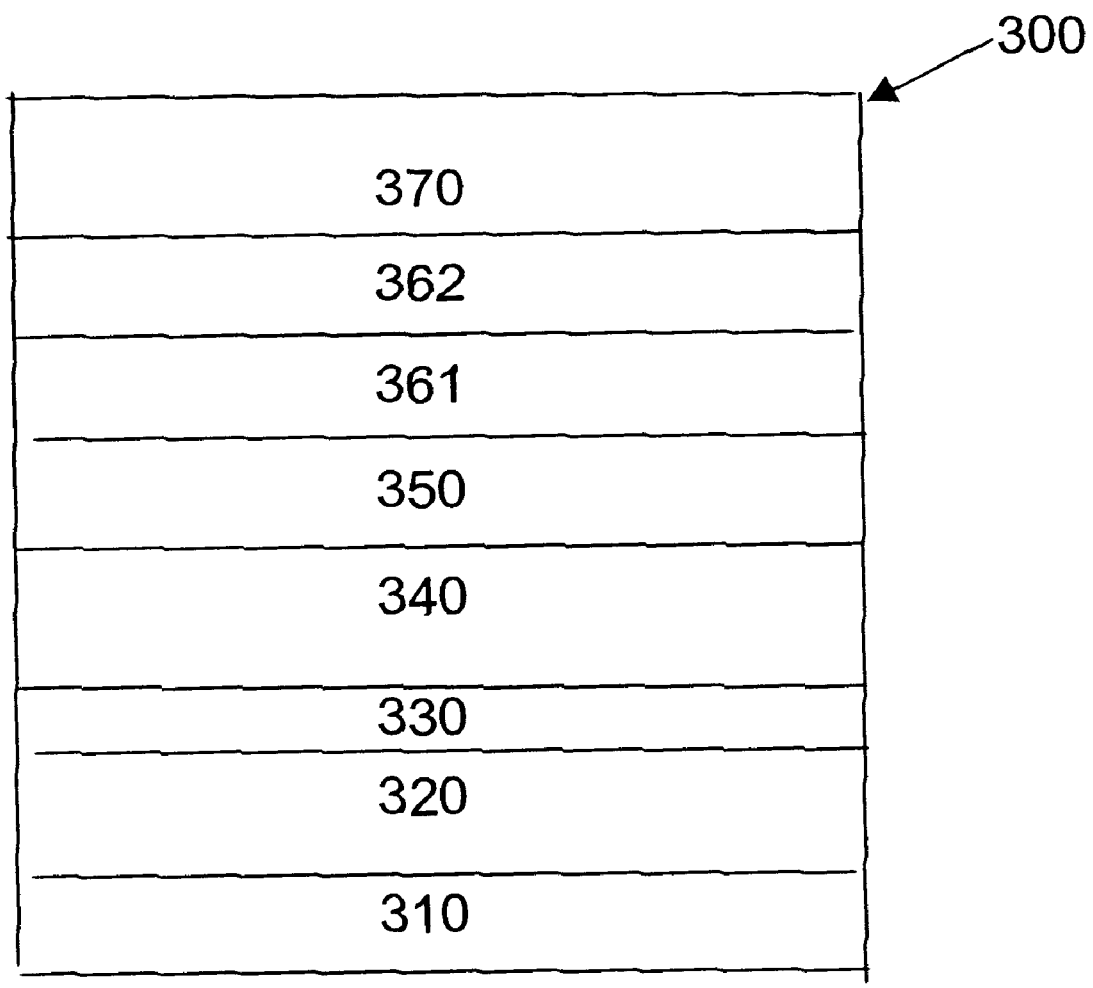
FIG. 3 depicts a white light producing OLED device according to the present invention.

FIG. 3 depicts an OLED of the present invention. This OLED 300 is similar to the OLED of the prior art 200 shown in FIG. 2, except that the hole-transport layer 340 is doped with a yellow dopant, the emission layer 350 is doped with a blue dopant. The electron transport layer consists of two sublayers. The sublayer 361 that is adjacent to the blue emitting layer contains a green emitting dopant and the sublayer 362 is undoped. Additional components include the substrate 310, anode 320, optional hole-injection layer 330, and cathode 370.

Figure 4:
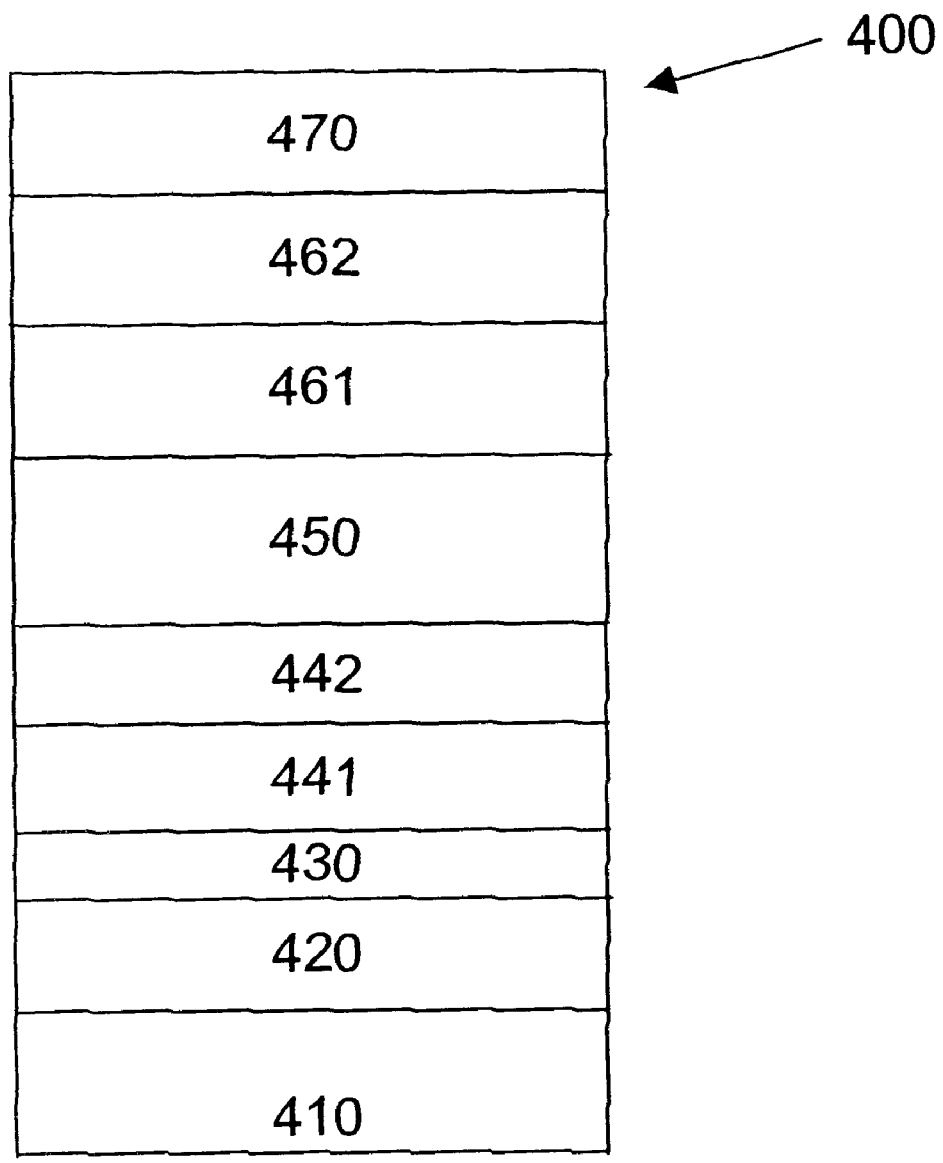
FIG. 4 depicts another structure of white light producing OLED device according the present invention.

FIG. 4 depicts another OLED of the present invention. This OLED 400 is similar to the OLED of the prior art 300 except that the hole transport layer consists of two layers 441 and 442. The layer 442 closest to the blue emitting layer is doped with a yellow dopant and the layer 441 is undoped. Further subdivision of the layers or sublayers is within the scope of this invention provided that the yellow doped hole transport layer is adjacent to the blue emitting layer 450. The electron transport layer 461 adjacent to the blue emitting layer is doped with a green emitting dopant and the layer 462 is undoped. Additional components include the substrate 410, anode 420, optional hole-injection layer 430, and cathode 470.

Figure 5:
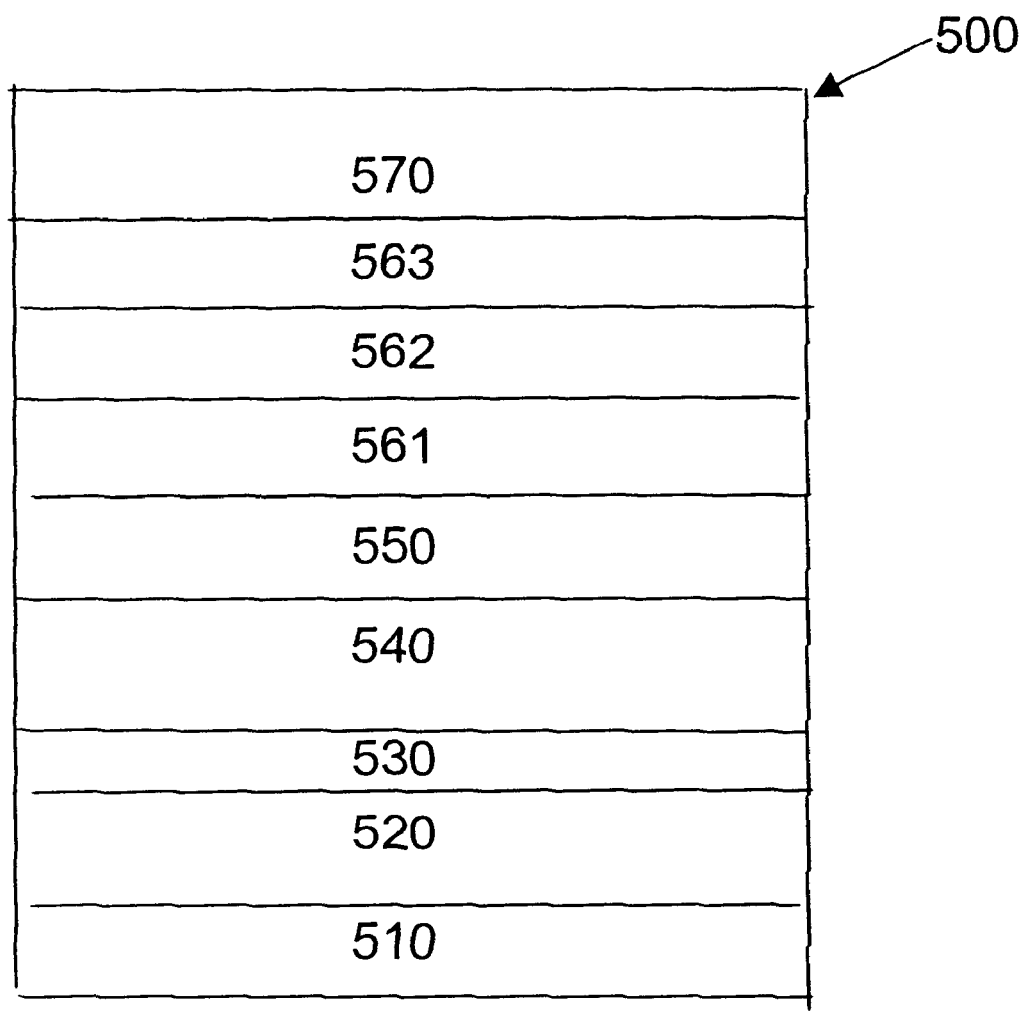
FIG. 5 depicts yet another white light producing OLED device according to the invention.

FIG. 5 depicts yet another OLED of the present invention. This OLED 500 is similar to OLED 300 except that the electron transport layer consists of three sublayers 561, 562 and 563. The sublayer 561 adjacent to the blue emitting layer 550 contains a yellow emitting dopant. The sublayer 562 contains green emitting dopant and sublayer 563 is undoped. The hole transport layer 540 is undoped. Additional components include the substrate 510, anode 520, optional hole-injection layer 530, and cathode 570.

Figure 6:
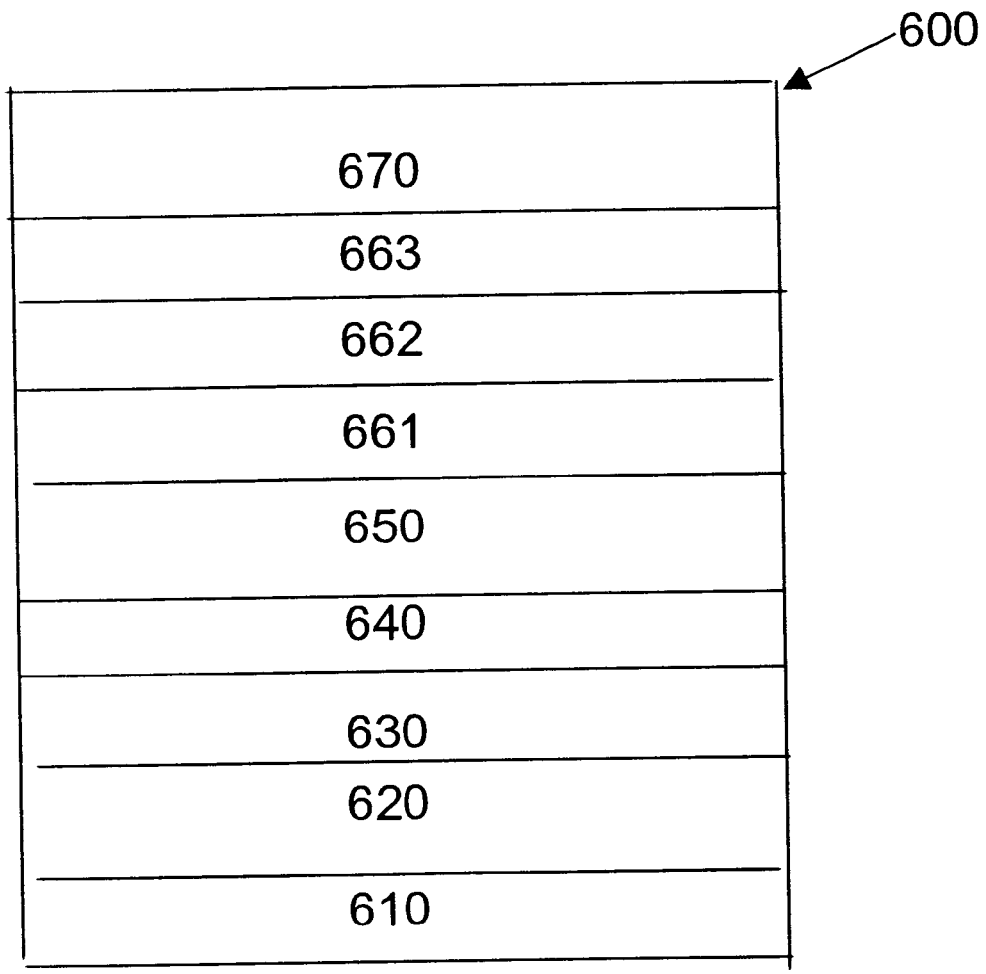
FIG. 6 depicts another structure of white light producing OLED device according to the invention.

FIG. 6 depicts yet another OLED of the present invention. This OLED 600 is similar to OLED 500 except that the hole transport layer 640 contains a yellow dopant. The electron transport layer consists of three sublayers 661, 662 and 663. The sublayer 661 adjacent to the blue emitting layer 650 contains a yellow emitting dopant. The sublayer 662 contains green emitting dopant and sublayer 663 is undoped. The hole transport layer 640 contains also a yellow emitting dopant. Thus the device structure this invention has yellow dopant both in the hole transport layer and in the electron transport layer adjacent to the blue emitting layer. Additional components include the substrate 610, anode 620, optional hole-injection layer 630, and cathode 670.

Figure 7:
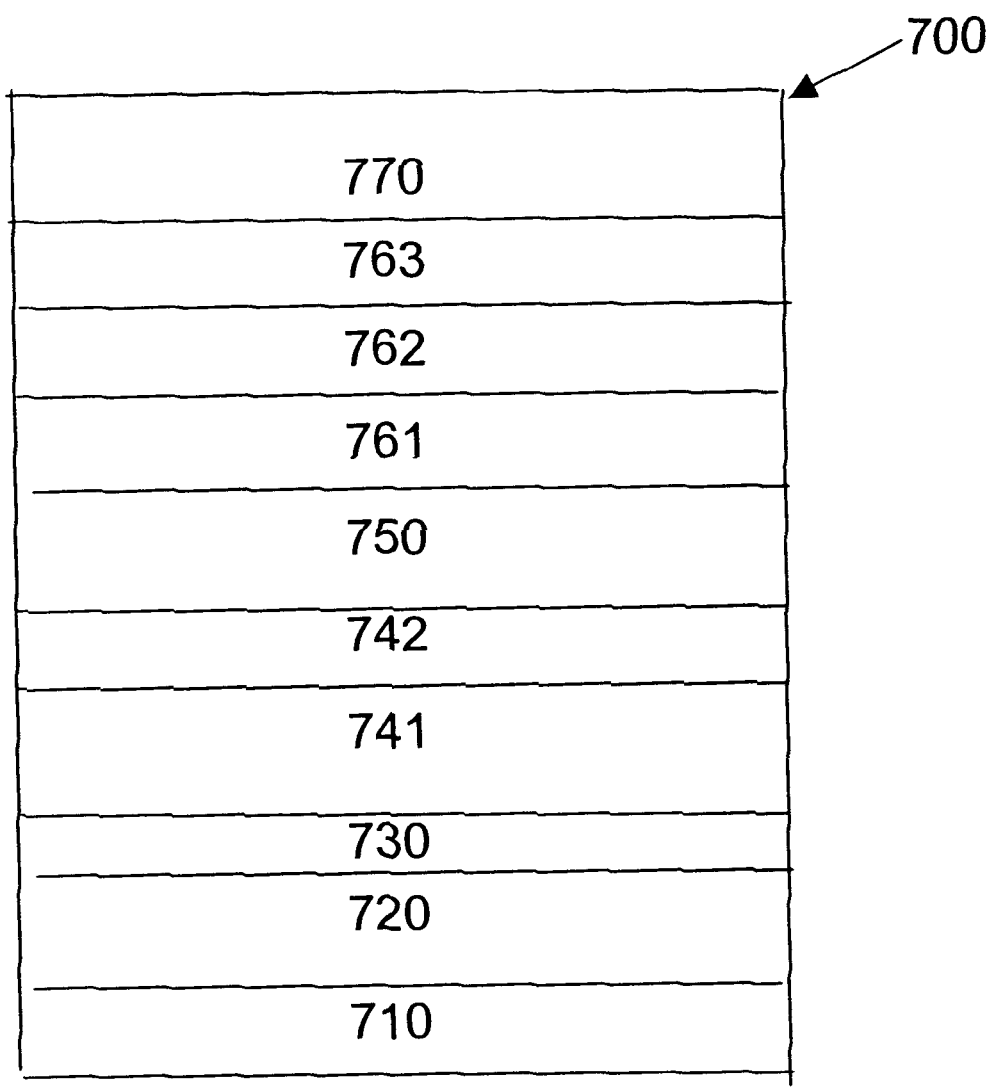
FIG. 7 depicts another structure of white light producing OLED device according to the invention.

FIG. 7 depicts yet another OLED of the present invention. This OLED 700 is similar to OLED 600 except that the hole transport layer consists of two sublayers 741 and 742. The sublayer 742 closest to the blue emitting layer 750 is doped with the yellow dopant, the sublayer 741 is undoped. The electron transport layer consists of three sublayers 761, 762, and 763. The sublayer 761 adjacent to the blue emitting layer 750 contains a yellow emitting dopant. The sublayer 762 contains green emitting dopant and sublayer 763 is undoped. Thus the device structure of OLED 700 contains the invention features of OLED devices 400 and 500. Additional components include the substrate 710, anode 720, optional hole-injection layer 730, and cathode 770.

The thickness of the hole-transport layer is between 20 and about 200 nm and preferably between 70 and 150 nm. The thickness of the emission layer is between 20 and about 100 nm and preferably between 20 and 75 nm. The thickness of the electron transport layer is between 20 and about 100 nm and preferably between 20 and 75 nm. When the hole-transport layer comprises a sub-layer containing a yellow dopant and disposed adjacent to the emission layer, the thickness of the sub-layer is between 2 and about 200 nm and preferably between 10 and 100 nm. When the hole-transport layer comprises a sub-layer lacking a yellow dopant and disposed adjacent to the anode (sub-layer 441 in FIG. 4 or sub-layer 641 in FIG. 6), the thickness of the sub-layer is between 2 and about 200 nm and preferably between 10 and 100 nm. Similarly, when the electron transport layer comprises sub-layers containing yellow dopant and disposed adjacent to the emission layer, the thickness of the sub-layer is between 2 and 50 nm and preferably between 10 and 35 nm. The thickness of the electron transport layer sub-layer containing a green dopant is between 2 and 50 nm, and the thickness of the undoped electron transport layer is between 2 and 50 and preferably between 20 and 40 nm. The thickness of the cathode layer is between 20 and 200 nm and preferably between 50 nm and 200 nm.

EXAMPLES

The invention and its advantages are further illustrated by the specific examples that follow. In describing the concentration of a dopant, any percentage refers to percentage by volume of the dopant with respect to the total material in the layer. Tables are also provided which summarize the results of the examples.

Comparative Example 1

An OLED device was constructed following the structure as shown in FIG. 3. Substrates coated with 80 nm ITO were sequentially ultrasonicated in a commercial detergent, rinsed in deionized water, degreased in toluene vapor. These substrates were treated with an oxygen plasma for about one minute and coated with one nm fluorocarbon layer by plasma assisted deposition of $CHF_3$. The same procedure was used for preparing all other devices described in this invention.

These substrates were loaded into a deposition chamber for organic layers and cathode depositions.

Device 1 was prepared by sequential deposition of 150 nm NPB hole transporting layer (HTL), 20 nm blue emission layer (EML) comprising TBADN host with 2% TBP blue dopant, 35 nm Alq electron transport layer (ETL), then 0.5 nm LiF and 200 nm Al as a part of cathode. The above sequence completed the deposition of the OLED device.

The OLED device was then hermetically packaged in a dry glove box filled with nitrogen for protection against ambient environment. The ITO patterned substrates used for preparing these OLED devices contained several Icons (or test patterns). Each individual icon of the device was tested for current voltage characteristics and the electroluminescence yield. The luminance characteristics of this Device 1 are given in Table 1. This device has blue emission with luminance yield of 2.5 cd/A and chromaticity color coordinates of $CIE_{x,y}$ (0.16, 0.20).

The operational stability of the encapsulated OLED devices in ambient environments was found by measuring the changes in the drive voltage and the luminance as a function of time when OLED devices were operated at a constant current density of 20 mA/cm². White OLED devices prepared by following the different structures of this invention have high operational stability.

Comparative Example 2

Device 2 was prepared following the same sequence as Device 1 except that NPB hole transport layer was in two sublayers, first 120 nm NPB was undoped, then 30 nm NPB was doped with 3% rubrene followed by 20 nm blue emitting layer. 150 nm NPB hole transport layer was doped with 3% rubrene yellow dopant. This device has CIEx,y coordinates of 0.33, 0.35 and has white emission. The yellow emission from the rubrene doped NPB hole transport layer and the blue emission from the TBP doped TBADN layer overall give white color emission. The color coordinates and the luminance efficiency can further be optimized with adjusting the individual dopant concentrations.

Comparative Example 3

Device 3 has structure similar to FIG. 3. It was prepared following the same sequence as Device 2 except that 10 nm Alq layer was doped with 0.12% C545T green dopant then followed by 25 nm undoped Alq. This device has significantly improved luminance yield and CIEx,y coordinates port layer, yellow dopant concentration in the hole transport layer and blue dopant TBP % in the blue emission layer.

Figure 8:
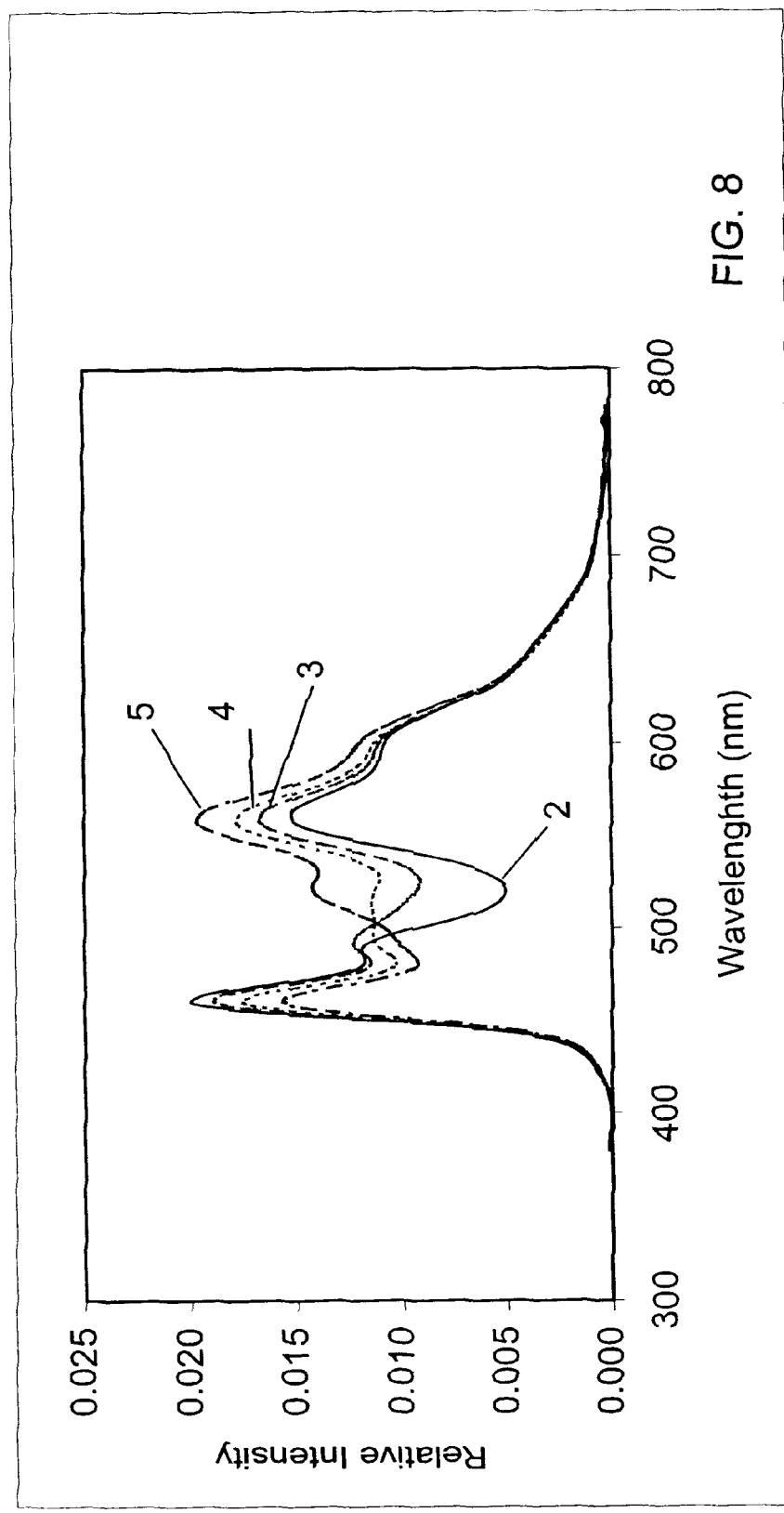
FIG. 8 shows EL spectral distribution as a function of green doping concentration in the green emitting layer.

FIG. 8 shows the EL spectra of the devices 2 to 5 wherein C545T dopant concentration was increased from 0 to 0.5% in the Alq ETL layer. The spectral component around the green emitting region increases significantly with increasing concentration of the green dopant in the Alq electron transport.

Figure 9:
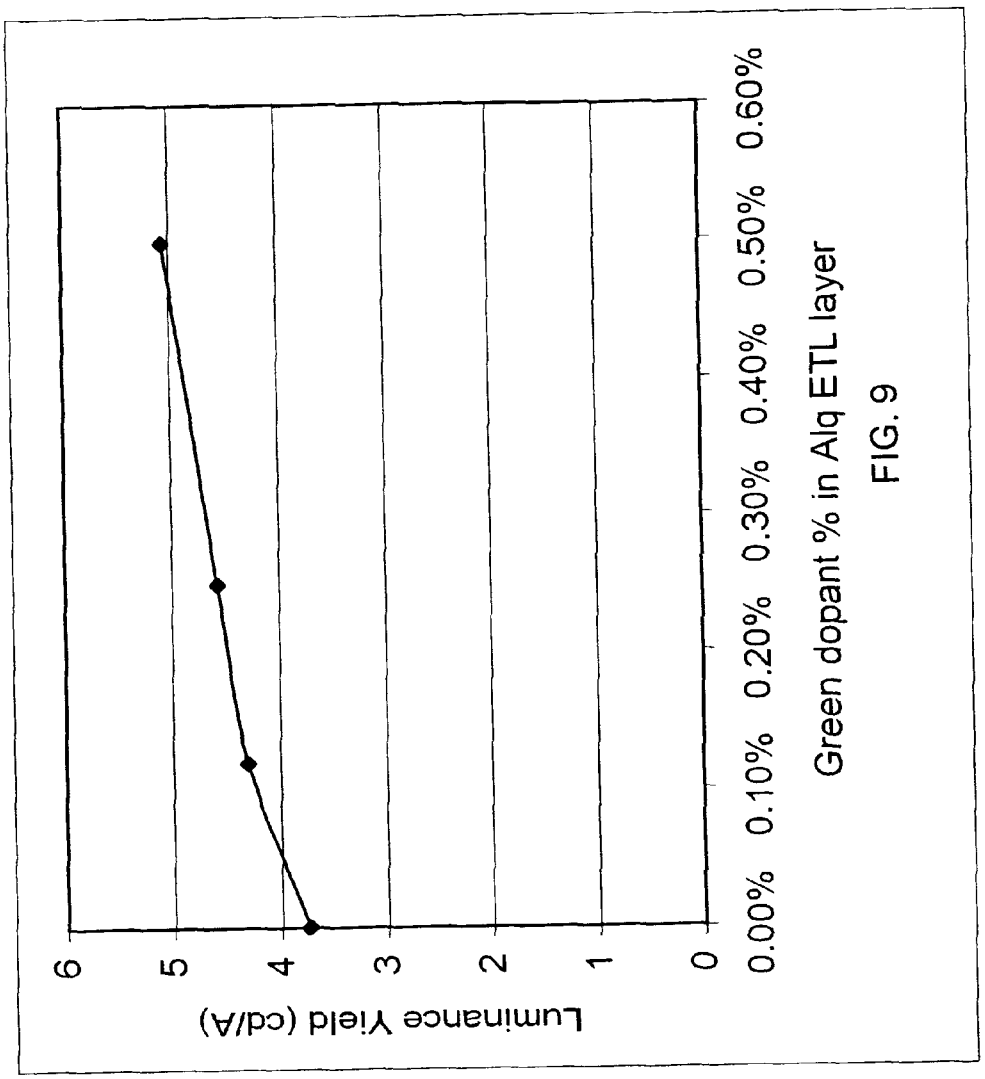
FIG. 9 shows a graph of luminance efficiency as a function of green doping into the green emitting layer.

FIG. 9 shows the luminance yield as a function of green C545T dopant % into the Alq electron transport layer. Again the luminance efficiency of the white OLED can be increased without adversely affecting the color of the white emitting OLED.

TABLE 1

EL characteristics of devices 1 to 5

| Device # | Hole transport Sublayer 1 | Hole transport Sublayer 2 | Emission layer | Electron transport sub-layer 1 | Electron Transport Sublayer 2 | Luminance Yield (cd/A) | Drive Voltage (volts) | CIEx | CIEy | Device color |
|---|---|---|---|---|---|---|---|---|---|---|
| 1 | 150 nm NPB | 0 | 20 nm TBADN + 2% TBP | 35 nm Alq | 0 | 2.5 | 7.4 | 0.16 | 0.20 | Blue |
| 2 | 120 nm NPB | 30 nm NPB + 3% Rubrene | 20 nm TBADN + 2% TBP | 35 nm Alq | 0 | 3.74 | 6.2 | 0.33 | 0.35 | White |
| 3 | 120 nm NPB | 30 nm NPB + 3% Rubrene | 20 nm TBADN + 2% TBP | 10 nm Alq + 0.12% C545T Green dopant | 25 nm Alq | 4.3 | 6.3 | 0.33 | 0.38 | White |
| 4 | 120 nm NPB | 30 nm NPB + 3% Rubrene | 20 nm TBADN + 2% TBP | 10 nm Alq + 0.25% C545T Green dopant | 25 nm Alq | 4.58 | 6.2 | 0.33 | 0.40 | White |
| 5 | 120 nm NPB | 30 nm NPB + 3% Rubrene | 20 nm TBADN + 2% TBP | 10 nm Alq + 0.50% C545T Green dopant | 25 nm Alq | 5.06 | 6.4 | 0.34 | 0.42 | White with Greenish tinge | similar to that device 2. Also noteworthy is the green emission peak around 520 nm as also is shown in the FIG. 8. This green portion was absent in the spectra of device 2. The device 3 overall has white color emission but with much higher luminance yield of that device 2. Thus, it was possible to produce white color with increased efficiency by green dopant in the Alq electron transport layer. The individual contribution of each of the color is particularly important, if white OLED light is used in combination with the R, G, B color filters to produce a full color OLED device. In turn, the individual R, G, B contributions to the full color OLED can be engineered by using the present invention.

Comparative Example 4

Device 4 was prepared following the same sequence as device 3 except that C545T concentrations into the 10 nm Alq layer was 0.25%. Further increase in the luminance yield was obtained.

Comparative Example 5

Device 5 was prepared following the same sequence as device 4 except that C545T concentration into the 10 nm Alq layer was 0. 5%. This device has high luminance efficiency of 5.1 cd/A. The CIEx,y coordinates were 0.34, 0.42 and the device color was white with little greenish tinge. Thus it is possible to optimize the efficiency and the color with optimum green dopant concentration in the Alq electron trans- Comparative Example 6

Device 6 has structure similar to FIG. 5. It was prepared following the same sequence as Device 1 except that after depositing the 20 nm blue emitting TBADN+2% TBP followed 10 nm Alq layer doped with 2% rubrene and then 25 nm undoped Alq layer. This device has CIEx,y coordinates of 0.29, 0.30 and has white emission. The yellow emission from the rubrene doped Alq electron transport layer and the blue emission from the TBP doped TBADN layer overall give a white color emission. The color coordinates and the luminance efficiency can further be optimized with adjusting the individual dopant concentrations.

Comparative Example 7

Device 7 has structure similar to FIG. 5 and was prepared following the same sequence as Device 6 except that after depositing the 10 nm Alq doped with 2% rubrene followed a 10 nm Alq layer doped 0.12% CFDMQA green dopant and then 15 nm undoped Alq layer. This device has CIEx,y coordinates of 0.33, 0.38 and has white emission. This device has higher luminance efficiency than that of device 6.

TABLE 2

EL characteristics of devices 6 & 7

| Device # | Hole transport Sublayer 1 | Hole transport Sublayer 2 | Emission layer | Electron transport sublayer 1 | Electron Transport Sublayer 2 | Electron Transport Sublayer 3 | Luminance Yield (cd/A) | Drive Voltage (volts) | CIEx | CIEy | Device color |
|---|---|---|---|---|---|---|---|---|---|---|---|
| 6 | 150 nm NPB | 0 nm | 20 nm TBADN + 2% TBP | 10 nm Alq + 2% Rubrene | 25 nm | 0 | 2.95 | 7.5 | 0.29 | 0.30 | White |
| 7 | 150 nm NPB | 0 nm | 20 nm TBADN + 2% TBP | 10 nm Alq + 2% Rubrene | 10 nm Alq + 0.12% C545T Green dopant | 15 nm Alq | 4.1 | 7.5 | 0.33 | 0.38 | White |

Comparative Example 8

Device 8 has structure similar to FIG. 6. 150 nm NPB hole transport layer was doped with 2% yellow emitting rubrene dopant and 10 nm Alq electron transport layer was doped with 1% rubrene. The blue emitting layer was 20 nm TBADN+2% TBP. This device gives white emission, has efficiency similar to device 1 and device 6, but was found to have much higher operational stability than both the devices 1 and 6.

Comparative Example 9

Device 9 has structure similar to FIG. 6 and was deposited following the same sequence as for device 8. Except that 10 nm Alq was doped with 1% rubrene and then 10 nm Alq was doped with 0.12% C545T green dopant and then 15 nm undoped Alq. This device has overall white emission but increased efficiency than the device 8. The operational stability was similar to device 8.

Comparative Example 10

Device 10 has structure similar to FIG. 7 and was deposited following the same sequence as for device 9. Except that the NPB hole transport layer has two sub-layers. First 120 nm NPB was undoped followed by 30 nm NPB doped with 2% Rubrene. This device has overall white emission and efficiency similar to device 9.

The white OLED emission can be used to prepare a full color device using the R, G, B color filters. The color filters are deposited either on the substrate or the white OLED device. In this case, white OLED is used as a backlight. Generally R, G, B color filters are integrated on the substrate using the microlithograpy patterning. This technique of producing of full color light has several advantages over the precision shadow masking technology used for producing the full colors. This technique does not require precision alignment, is low cost and easy to manufacture. The substrate itself contains thin film transistors to address the individual pixels. U.S. Pat. Nos. 5,550,066 and 5,684,365 both by Tang and Hseih describe the addressing methods of the TFT substrates. Some other techniques for preparing full color devices using the white OLEDs are given in an article by P. F. Burrows et al., IEEE Trans. Electron Device 44, 1188 (1997).

The invention has been described in detail with particular reference to certain preferred embodiments thereof, but it will be understood that variations and modifications can be effected within the spirit and scope of the invention.

Parts List

100 OLED device
110 substrate
120 anode contact
140 organic electroluminescent layer
150 cathode contact
200 OLED device
210 substrate
220 transparent anode
230 hole injection layer
240 hole transport layer
250 organic electroluminescent layer
260 organic electron transport layer
270 cathode contact
300 OLED device
310 substrate
320 transparent anode
330 hole injection layer
340 hole transport layer
350 organic electroluminescent layer
361 organic electron transport layer

TABLE 3

EL characteristics of devices 8 to 10

| Device # | Hole transport Sublayer 1 | Hole transport Sublayer 2 | Emission layer | Electron transport sublayer 1 | Electron Transport Sublayer 2 | Electron Transport Sublayer 3 | Luminance Yield (cd/A) | Drive Voltage (volts) | CIEx | CIEy | Device color |
|---|---|---|---|---|---|---|---|---|---|---|---|
| 8 | 0 | 150 nm NPB + 2% NPB | 20 nm TBADN + 2% TBP | 10 nm Alq + 1% Rubrene | 25 nm | 0 | 3.74 | 6.2 | 0.33 | 0.35 | White |
| 9 | 0 | 150 nm NPB + 2% NPB | 20 nm TBADN + 2% TBP | 10 nm Alq + 1% Rubrene | 10 nm Alq + 0.12% C545T Green dopant | 15 nm Alq | 4.4 | 6.5 | 0.33 | 0.38 | White |
| 10 | 120 nm NPB | 30 nm NPB + 2% NPB | 20 nm TBADN + 2% TBP | 10 nm Alq + 1% Rubrene | 10 nm Alq + 0.12% C545T Green dopant | 15 nm Alq | 4.5 | 6.4 | 0.33 | 0.38 | White |

362 organic electron transport layer
370 cathode contact
400 OLED device
410 substrate
420 transparent anode
430 hole injection layer
441 hole transport layer
442 hole transport layer
450 electroluminescent layer
461 organic electron transport layer
462 organic electron transport layer
470 cathode contact
500 OLED device
510 substrate
520 transparent anode
530 hole injection layer
540 hole transport layer
550 electroluminescent layer
561 organic electron transport layer
562 organic electron transport layer
563 organic electron transport layer
570 cathode contact
600 OLED device
610 substrate
620 transparent anode
630 hole injection layer
640 hole transport layer
650 electroluminescent layer
661 organic electron transport layer
662 organic electron transport layer
663 organic electron transport layer
670 cathode contact
700 OLED device
710 substrate
720 transparent anode
730 hole injection layer
741 hole transport layer
742 hole transport layer
750 electroluminescent layer
761 organic electron transport layer
762 organic electron transport layer
763 organic electron transport layer
770 cathode contact

What is claimed is:

1. An organic light-emitting diode (OLED) device which produces substantially white light, comprising:
   a) a substrate;
   b) an anode disposed over the substrate;
   c) a hole injecting layer disposed over the anode;
   d) a hole transport layer disposed over the hole injecting layer;
   e) a light-emitting layer doped with a blue light-emitting compound, disposed directly on the hole transport layer;
   f) an electron transport layer disposed over the blue compound doped light-emitting layer;
   g) a cathode disposed over the electron transport layer;
   h) the hole transport layer, being selectively doped in a region which corresponds to an entire layer or a partial portion of a layer in contact with the blue compound doped light-emitting layer, the selective doping being with a compound which emits light in the yellow region of the spectrum; and
   i) the electron transport layer being selectively doped with a compound in a region which corresponds to an entire layer or a partial portion of a layer in contact with the blue compound doped light-emitting layer, the selective doping being with a compound which emits light in the green region of the spectrum.

2. The OLED device of claim 1 wherein the yellow doped hole transport layer is doped with a rubrene compound.

3. The OLED device according to claim 2 wherein the cathode is selected from the group consisting of LiF/Al, Mg:Ag, Al:Mg, and Al:Li.

4. The OLED device according to claim 2 wherein the cathode is transparent.

5. The OLED device according to claim 2 wherein the electron transport layer is transparent.

6. The OLED device according to claim 2 wherein thickness of the electron transport layer is between 10 nm–150 nm.

7. The OLED device according to claim 2 wherein the hole transport layer includes a host material and the yellow light-emitting compound is rubrene with the concentration of rubrene being between 0.1–10% percent of the host material.

8. The OLED device according to claim 2 wherein thickness of the blue compound doped light-emitting layer is between 10 nm–100 nm.

9. The OLED device according to claim 1 wherein the green compound doped layer includes a host material and the dopant concentration is between 0.1–2% percent of the host material.

10. The OLED device according to claim 1 wherein thickness of the hole transport layer is between 20 nm–300 nm.

11. The OLED device according to claim 1 wherein the hole transport layer includes an aromatic tertiary amine.

12. The OLED device according to claim 1 wherein the electron transport layer includes tris(8-hydroxy quinolinol) aluminum.

13. The OLED device according to claim 1 wherein the blue compound doped light-emitting layer includes host material selected from the group consisting of:

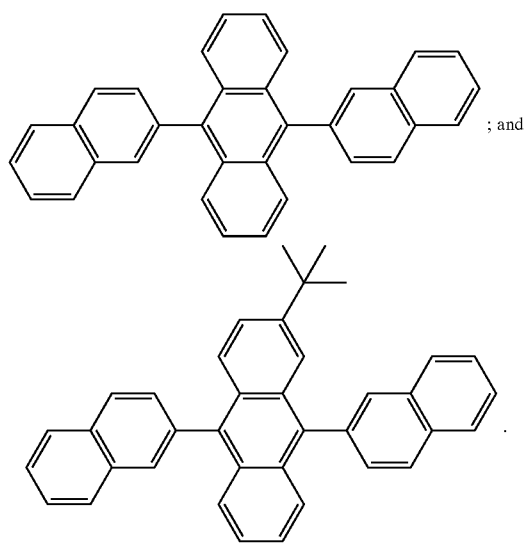

; and

14. The OLED device according to claim 1 wherein the blue compound doped light-emitting layer includes a blue dopant compound selected from the group consisting of:

i)

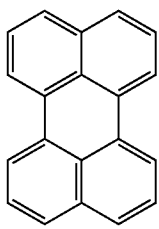

ii) 2,5,8,11-tetra-tert-butyl perylene

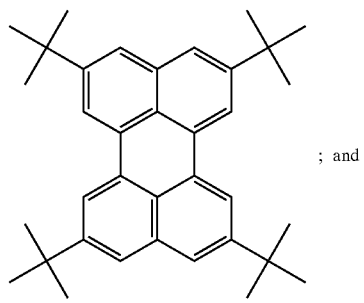

; and iii) a conjugated benzenoid of the formula

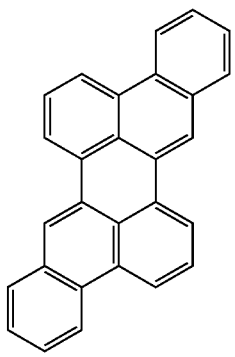

.

15. The OLED device according to claim 1 wherein the blue compound doped layer includes a host material and the dopant concentration is between 0.1–10% percent of the host material.

16. An organic light-emitting apparatus for producing selected colors, comprising:
 a) a plurality of selectable OLED pixels each one of which, when selected, produces substantially white light;
 b) a plurality of colored filters corresponding to different ones of the selectable OLED pixels such that when white light passes through said filters, a particular color will be produced;
 c) means for selecting OLED pixels to cause them to produce white light; wherein each pixel includes:
 d) a substrate;
 e) an anode disposed over the substrate;
 f) a hole injecting layer disposed over the anode;
 g) a hole transport layer disposed over the hole injecting layer;
 h) a light-emitting layer doped with a blue light-emitting compound, disposed directly on the hole transport layer;
 i) an electron transport layer disposed over the blue compound doped light-emitting layer;
 j) a cathode disposed over the electron transport layer;
 k) the hole transport layer, being selectively doped in a region which corresponds to an entire layer or a partial portion of a layer in contact with the blue compound doped light-emitting layer, the selective doping being with a compound which emits light in the yellow region of the spectrum; and
 l) the electron transport layer being selectively doped with a compound in a region which corresponds to an entire layer or a partial portion of a layer in contact with the blue compound doped light-emitting layer, the selective doping being with a compound which emits light in the green region of the spectrum.

17. The apparatus of claim 16 wherein the filters are integrated on the substrate or provided over the OLED pixels.

18. The apparatus of claim 16 wherein the selecting means includes circuitry associated with the anode or cathode, each OLED pixel which, when activated, causes an electric field to be produced to cause the emission of white light.

19. An organic light-emitting apparatus for producing selected colors, comprising:
 a) a plurality of selectable OLED pixels each one of which, when selected, produces substantially white light;
 b) a plurality of colored filters corresponding to different ones of the selectable OLED pixels such that when white light passes through said filters, a particular color will be produced;
 c) means for selecting OLED pixels to cause them to produce white light; wherein each pixel includes:
 d) a substrate;
 e) an anode disposed over the substrate;
 f) a hole injecting layer disposed over the anode;
 g) a hole transport layer disposed over the hole injecting layer;
 h) a light-emitting layer doped with a blue light-emitting compound, disposed directly on the hole transport layer;
 i) an electron transport layer doped with a compound for emitting light in the yellow region of the spectrum and disposed directly over the blue compound doped light-emitting layer;
 j) an electron transport layer doped with a compound for emitting light in the green region of the spectrum and disposed directly over the yellow light-emitting layer; and
 k) a cathode disposed over the electron transport layer.

20. An organic light-emitting apparatus for producing selected colors, comprising:
 a) a plurality of selectable OLED pixels each one of which, when selected, produces substantially white light;
 b) a plurality of colored filters corresponding to different ones of the selectable OLED pixels such that when white light passes through said filters, a particular color will be produced;
 c) means for selecting OLED pixels to cause them to produce white light; wherein each pixel includes:
 d) a substrate;
 e) an anode disposed over the substrate;

f) a hole injecting layer disposed over the anode;
g) a hole transport layer disposed over the hole injecting layer doped with a rubrene compound for emitting light in the yellow region of the spectrum;
h) a light-emitting layer doped with a blue light-emitting compound, disposed directly on the hole transport layer,
i) an electron transport layer doped with a rubrene compound for emitting light in the yellow region of the spectrum disposed directly over the blue compound doped light-emitting layer;
j) an electron transport layer doped with a green compound for emitting light in the green region of the spectrum disposed directly over the yellow light-emitting layer;and
k) a cathode disposed over the electron transport layer.

21. An organic light-emitting diode device which produces substantially white light, comprising:
a) a substrate;
b) an anode disposed over the substrate;
c) a hole injecting layer disposed over the anode;
d) a hole transport layer disposed over the hole injecting layer;
e) a light-emitting layer doped with a blue light-emitting compound, disposed directly on the hole transport layer;
f) a first electron transport layer doped with a compound for emitting light in the yellow region of the spectrum and disposed directly over the blue compound doped light-emitting layer;
g) a second electron transport layer doped with a compound for emitting light in the green region of the spectrum and disposed directly over the first electron transport layer; and
h) a cathode disposed over the electron transport layer.

22. The OLED device according to claim 21 further including a third electron transport layer disposed on the second electron transport layer wherein the third electron transport layer includes tris(8hydroxy quinolinol)aluminum.

23. The OLED device according to claim 21 further including a third electron transport layer disopsed on the second electron transport layer wherein the third electron transport layer includes copper phthalocyanine compound.

24. The OLED device according to claim 21 wherein the blue compound doped light-emitting layer includes host material selected from the group consisting of:

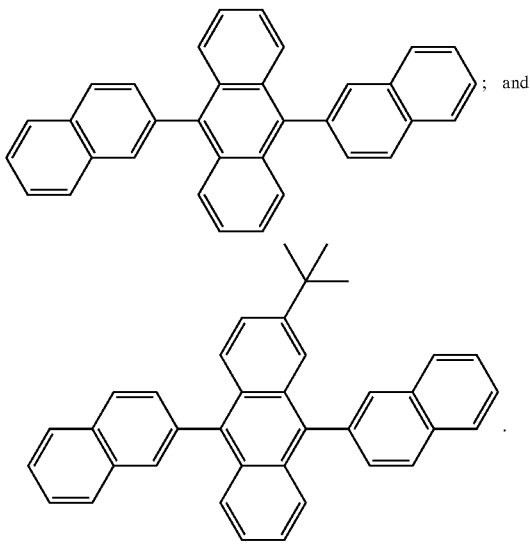
; and

25. The OLED device according to claim 21 wherein the blue light-emitting compound is selected from the group consisting of:
i) perylene

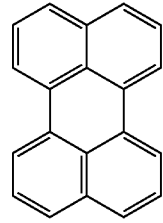

ii) 2,5,8,11-tetra-tert-butyl perylene

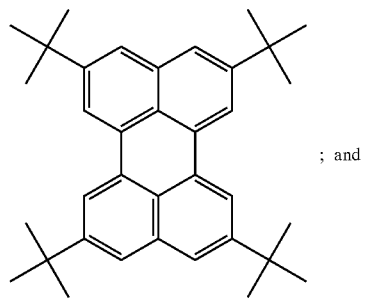
; and iii) a conjugated benzenoid of the formula

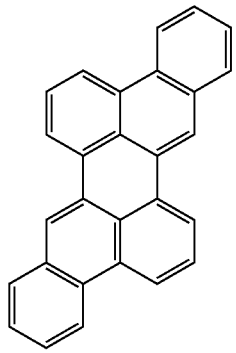

26. The OLED device according to claim 21 wherein the yellow compound doped layer includes a host material and the yellow light-emitting compound is rubrene with the concentration of rubrene being between 0.1–10% percent of the host material.

27. The OLED device according to claim 21 wherein the blue compound doped layer includes a host material and the dopant with the concentration for the blue compound is between 0.1–10% percent of the host material.

28. The OLED device according to claim 21 wherein thickness of the blue compound doped light-emitting layer is between 10–100 nm.

29. The OLED device according to claim 21 wherein the hole transport layer includes an aromatic tertiary amine.

30. The OLED device according to claim 21 wherein the cathode is selected from the group consisting of LiF/Al, Mg:Ag, Al:Mg, and Al:Li.

31. The OLED device according to claim 21 wherein the cathode is transparent.

32. The OLED device according to claim 21 wherein the electron transport layer is transparent.

33. The OLED device according to claim 21 wherein thickness of the hole transport layer is between 20–300 nm.

34. The OLED device according to claim 21 wherein thickness of the electron transport layer is between 100–150 nm.

35. The OLED device according to claim 21 wherein the hole transport layer is aromatic tertiary amines.

36. The OLED device according to claim 21 wherein the electron transport layer is tris(8-hydroxy quinolinol) aluminum.

37. An organic light-emitting diode device which produces substantially white light, comprising:
   a) a substrate;
   b) an anode disposed over the substrate;
   c) a hole injecting layer disposed over the anode;
   d) a hole transport layer disposed over the hole injecting layer doped with a rubrene compound for emitting light in the yellow region of the spectrum;
   e) a light-emitting layer doped with a blue light-emitting compound, disposed directly on the hole transport layer,
   f) a first electron transport layer doped with a rubrene compound for emitting light in the yellow region of the spectrum disposed directly over the blue compound doped light-emitting layer;
   g) a second electron transport layer doped with a green compound for emitting light in the green region of the spectrum disposed directly over the first electron transport layer; and
   h) a cathode disposed over the second electron transport layer.

38. The OLED device according to claim 37 wherein the blue compound doped light-emitting layer includes the blue dopant selected from the group consisting of:
   i) perylene

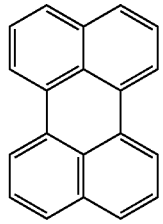

ii) 2,5,8,11-tetra-tert-butyl perylene

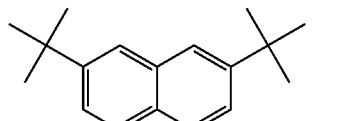

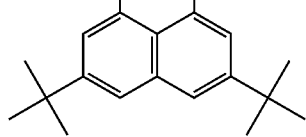

iii) a conjugated benzenoid.

39. The OLED device according to claim 37 wherein the hole transport and the first electron transport layers each includes host material with the concentration of the rubrene compound in both the hole transport and electron transport layers being between 0.1–10% percent of the host material.

40. The OLED device according to claim 37 wherein the blue compound doped layer includes a host material and the dopant with the concentration for the blue compound is between 0.1–10% percent of the host material.

41. The OLED device according to claim 37 wherein thickness of the hole transport layer is between 20–300 nm.

42. The OLED device according to claim 37 wherein thickness of the blue compound doped light-emitting layer is between 10–100 nm.

43. The OLED device according to claim 37 wherein thickness of the electron transport layer is between 100–150 nm.

44. The OLED device according to claim 37 wherein the cathode is selected from the group consisting of LiF/Al, Mg:Ag, Al:Mg, and Al:Li.

45. The OLED device according to claim 37 wherein the cathode is transparent.

46. The OLED device according to claim 37 wherein the electron transport layer is transparent.

47. The OLED device according to claim 37 further including an undoped third electron transport layer disposed on the second electron transport layer.

48. The OLED device according to claim 37 wherein the hole transport layer includes an aromatic tertiary amine.

49. The OLED device according to claim 37 further including a third electron transport layer disposed on the second electron transport layer wherein the third electron transport layer includes tris(8-hydroxy quinolinol) aluminum.

50. The OLED device according to claim 37 further including a third electron transport layer disposed on the second electron transport layer wherein the third electron transport layer includes copper phthalocyanine compound.

51. The OLED device according to claim 37 wherein the blue compound doped light-emitting layer includes a host material selected from the group consisting of:

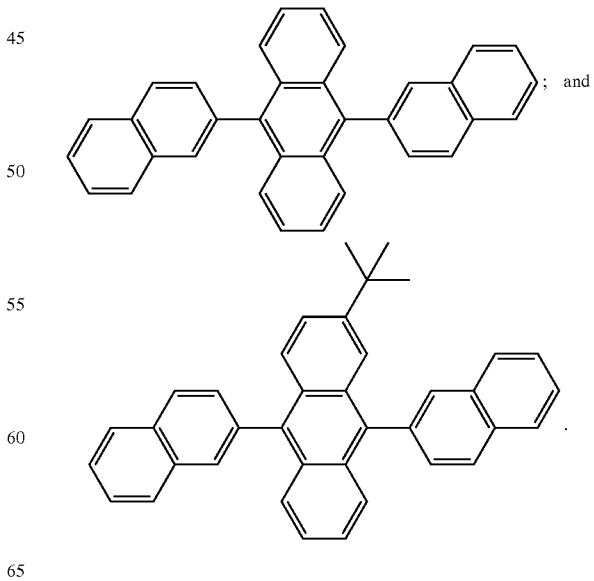

* * * * *

UNITED STATES PATENT AND TRADEMARK OFFICE
CERTIFICATE OF CORRECTION

PATENT NO.     : 6,627,333 B2
DATED          : September 30, 2003
INVENTOR(S)    : Tukaram K. Hatwar It is certified that error appears in the above-identified patent and that said Letters Patent is hereby corrected as shown below:

Column 13,
Table 3, column entitled "Hole transport Sublayer 2"
"150 nm NPB + 2% NPB" should read -- 150 nm NPB + 2% Rubrene -- (both occurrences); and "30 nm NPB + 2% NPB" should read -- 30 nm NPB + 2% Rubrene --

Signed and Sealed this

Twenty-ninth Day of June, 2004

JON W. DUDAS
*Acting Director of the United States Patent and Trademark Office*